(12) United States Patent
Mizuhara et al.

(10) Patent No.: US 6,380,064 B1
(45) Date of Patent: Apr. 30, 2002

(54) SEMICONDUCTOR DEVICES AND PROCESS FOR PRODUCING THE SAME

(75) Inventors: Hideki Mizuhara; Shinichi Tanimoto; Hiroyuki Watanabe, all of Bisai; Yasunori Inoue, Ogaki, all of (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/223,404

(22) Filed: Dec. 30, 1998

Related U.S. Application Data

(62) Division of application No. 08/953,822, filed on Sep. 25, 1997, now Pat. No. 5,898,221.

(30) Foreign Application Priority Data

Sep. 27, 1996 (JP) .............................................. 8-256319

(51) Int. Cl.⁷ .......................................... H01L 21/4763
(52) U.S. Cl. ...................... 438/622; 438/605; 438/607; 438/618
(58) Field of Search ................................ 738/605, 622, 738/607

(56) References Cited

U.S. PATENT DOCUMENTS

| | | | |
|---|---|---|---|
| 4,692,385 A | * | 9/1987 | Johnson |
| 4,823,182 A | * | 4/1989 | Okumura |
| 5,414,301 A | * | 5/1995 | Thomas |

FOREIGN PATENT DOCUMENTS

| | | |
|---|---|---|
| JP | 03-163875 | 7/1991 |
| JP | 04-014874 A | 1/1992 |
| JP | 06-132286 A | 5/1994 |

OTHER PUBLICATIONS

Choi et al., Electrical Characteristics of TiB2 for ULSI Applications, pp. 2341–2345, (IEEE), 1992.*

T. Amazawa, Fully Planarized Four—Level Interconnection with Stacked Vias using CMP of Selective CVD–Al and Insulator and its Application to Quarter Micron Gate Array LSIs.*

* cited by examiner

*Primary Examiner*—Long Pham
(74) *Attorney, Agent, or Firm*—Sheridan Ross P.C.

(57) ABSTRACT

A semiconductor device having a semiconductor substrate and a wiring layer, which is doped with an impurity, located on the substrate. The semiconductor device has upper and lower wiring layers apart from each other. An electric insulating film electrically insulates between the upper and lower wiring layers. The insulating film has a contact hole. A wiring material is packed with the contact hole to electrically connect the upper and lower wiring layers. The impurity is contained in the lower wiring layer to decrease its resistivity.

16 Claims, 7 Drawing Sheets

SEMICONDUCTOR DEVICES AND PROCESS FOR PRODUCING THE SAME

This application is a divisional of application 08/953,822, filed Sep. 25, 1997, now U.S. Pat. No 5,898,221.

BACKGROUND OF THE INVENTION

The present invention relates generally to a semiconductor device and a process for producing the same, more particularly to a technique of forming multilayered wiring.

Recently, multilayer wiring structures employed in highly integrated semiconductor devices are required to have reduced resistance in inter-wiring contacts (via contacts) and improved wiring reliability.

FIGS. 11 to 13 show, in cross-sectional views, a process for producing a conventional two-layer wiring, which will be described below step by step.

In Step A (see FIG. 11), a silicon oxide film 52 is deposited as an insulating film to an appropriate thickness on the surface of a single crystal silicon substrate 51 by means of CVD (chemical vapor deposition) method. Next, a titanium (Ti) thin film 53, a titanium nitride (TiN) thin film 54, an aluminum (Al) alloy thin film 55 and a titanium nitride (TiN) thin film 56 are deposited successively on the surface of the silicon oxide film 52 by means of sputtering to form a first wiring layer 71.

Subsequently, the thus formed first wiring layer 71 is subjected to patterning employing the conventional photolithographic technique, followed by dry etching to form a wiring pattern of the first wiring layer. It should be noted here that the aluminum alloy thin film 55 contains, in addition to pure aluminum, other metals or high-melting metals (e.g., Al—Si (1%)-Cu (0.5%), Al—Cu and Al—Mg).

Use of such aluminum alloys instead of pure aluminum can prevent electromigration and stress migration from occurring. Electromigration refers to migration of aluminum atoms due to the electron current, while stress migration refers to shifting of the sites where stress is induced by heat, and both phenomena can cause disconnection.

Further, the titanium thin film 53 and the titanium nitride thin film 54 formed under the aluminum alloy thin film 55 are to prevent adhesion at contact sections (not shown) between the aluminum alloy thin film 55 and the substrate 51 from being destroyed by the reaction between Al and Si. If these films 53 and 54 are not present, aluminum in the aluminum thin film 55 reacts with the silicon substrate 51, when heat treatment is carried out after formation of the first wiring layer. Thus, while Al and Si form an eutectoid, the Si is supplied from the silicon substrate 51, so that adhesion at each interface is destroyed. Accordingly, the titanium thin film 53 and the titanium nitride thin film 54 are formed under the aluminum alloy thin film 55 to prevent a reaction at each interface from occurring.

Further, the reason why the titanium thin film 53 is formed under the titanium nitride thin film 54 is that the contact resistance is increased if the titanium nitride film 54 only is formed. As described above, the titanium nitride thin film 54 and the titanium thin film 53 serve as barrier metals. Further, the titanium nitride thin film 56 formed on the aluminum alloy thin film 55 is to prevent the aluminum alloy thin film 55, when subjected to photolithographic light exposure, from reflecting light. In other words, the titanium nitride thin film 56 serves as a reflection preventive film (cap metal).

In Step B (see FIG. 12), a silicon oxide film 57 is deposited as a layer insulating film by means of CVD to an appropriate thickness on the surface of the titanium nitride thin film 56 of the first wiring layer, and patterning of contact holes is carried out by employing a conventional photolithographic technique, followed by formation of contact holes 58 by means of dry etching.

In Step C (see FIG. 13), etching scum in the contact holes 58 and the oxide film present on the surface of the titanium nitride thin film 56 of the first wiring layer 71 in each contact hole 58 is removed by means of sputter etching employing an inert gas (e.g., argon).

Next, a titanium nitride thin film 59, an aluminum alloy thin film 60 and a titanium nitride thin film 61 are deposited successively onto the surface of the silicon oxide film 57 and in the contact holes 58 to form a second wiring layer 72.

Subsequently, the second wiring layer 72 is subjected to patterning employing a conventional photolithographic technique followed by dry etching to form a wiring pattern of the second wiring layer 72 to complete the process of producing the two-layer wiring. The aluminum alloy thin film 60 is of the same material as the aluminum alloy thin film 55.

The titanium nitride thin film 61 formed on the aluminum alloy thin film 60 serves as a cap metal like the titanium nitride thin film 56. Further, the titanium nitride thin film 59 formed under the aluminum alloy thin film 60 is to control growth of hillocks caused by heat treatment such as sintering and alloying. More specifically, since growth of hillocks induces short-circuiting in the wirings, the titanium nitride thin film 54 is formed under the aluminum alloy thin film 60 to control growth of hillocks.

However, in the prior art-exemplified above, while an increase in the contact resistance is controlled, for example, by forming the titanium thin film 53 under the titanium nitride thin film 54 in Step A, only the titanium nitride thin films 56 and 59 are present at contact portions between the first wiring layer and the second wiring layer.

Recently, semiconductor devices have become more and more integrated, so that contact holes 58 are required to have smallest possible diameters, and it is essential to prevent contact resistance between the first wiring layer and the second wiring layer from increasing. Under such circumstances, Japanese Unexamined Patent Publication No. 7-142580 describes a laminate structure. In this publication, titanium nitride thin film/titanium thin film is employed at contact portions between the first wiring layer and the second wiring layer, and while the function as cap metals is retained, contact resistance is lowered and electromigration resistance is improved.

Although the prior art semiconductor of the above Japanese publication has excellent contact resistance and electromigration resistance, it is slightly inferior, due to the additional formation of titanium thin film to semiconductors having a titanium nitride thin film only in serving the demand for finer or highly integrated wirings.

SUMMARY OF THE INVENTION

The present invention relates to a semiconductor device and a process for producing the same, and it is an objective of the present invention to provide a semiconductor device in which the thickness of wiring layers are reduced, while the cap metal retains its function, so as to achieve fining and higher integration of wirings, as well as, a process for producing the same.

In the process for producing the semiconductor device according to the present invention, wiring layers are formed on a semiconductor substrate, and the wiring layers are doped with an impurity.

The semiconductor device according to the present invention has a lower wiring layer and an upper wiring layer that are spaced away from each other. An insulating film is electrically insulating the lower wiring layer and the upper wiring layer from each other. The insulating film contains contact holes. The contact holes are packed with a wiring material for electrically connecting the lower wiring layer to the upper wiring layer. The lower wiring layer contains an impurity for reducing its resistivity.

Other aspects and advantages of the invention will become apparent from the following description, taken in conjunction with the accompanying drawings, illustrating by way of example the principals of the invention.

BRIEF DESCRIPTION OF THE DRAWINGS

The invention, together with the objects and advantages thereof, may best be understood by reference to the following description of the presently preferred embodiments together with the accompanying drawings in which.

DETAILED DESCRIPTION OF THE PREFERRED EMBODIMENTS

A process for producing the semiconductor device according to one embodiment of the invention will be described referring to FIGS. 1 to 9.

Figure 1:
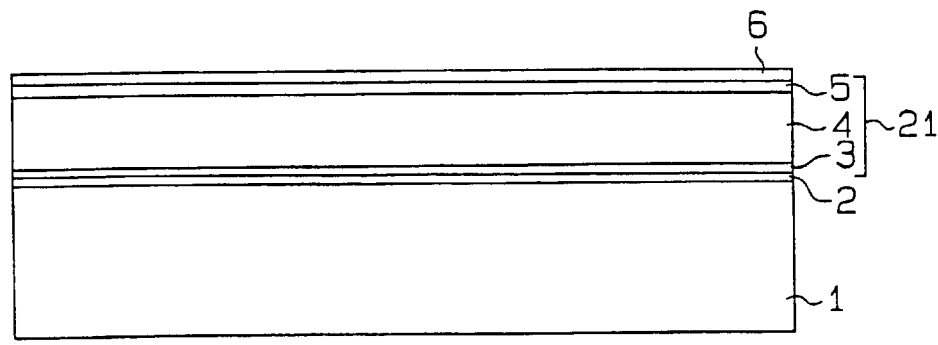
FIGS. 1 to 9 show schematic cross-sectional views of a process for producing a semiconductor device according to one embodiment of the invention.

In Step 1 shown in FIG. 1, a Ti film 2 (50 nm thick), a TiN film 3 (100 nm thick), an Al alloy film 4 (Al—Si (1%)-Cu (0.5%), 600 nm thick), a Ti film 5 (20 nm thick) and a TiN film 6 (100 nm thick) are formed on a single crystal silicon substrate 1 in this order by means of magnetron sputtering. Thus, a first wiring layer 21 is formed. Active elements (not shown) such as MOS transistors are formed beforehand on the surface of the silicon substrate 1 and are covered with a silicon oxide film (not shown) serving as an insulating film.

Figure 2:
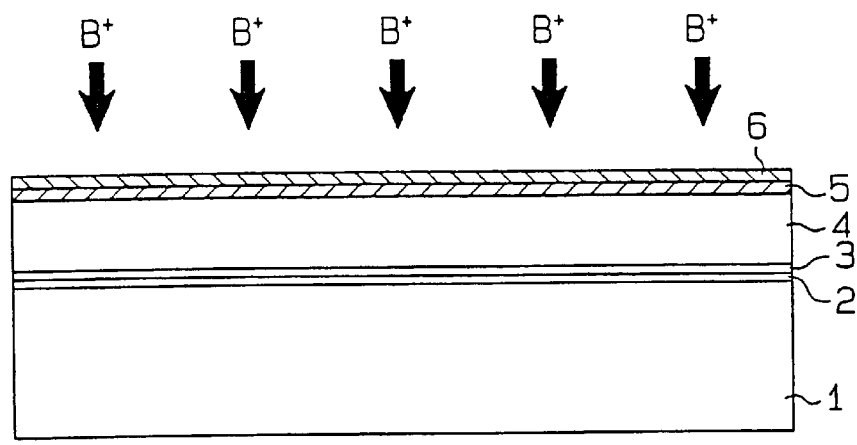

In Step 2 shown in FIG. 2, boron ion (B$^+$) is implanted over the entire surface of the semiconductor device by means of ion implantation under the following conditions: acceleration energy, 40 KeV; and dose, 1×10$^{15}$ ions/cm$^2$. Under the conditions described above, the peak of ion concentration distribution is in the Ti film 5 as shown in FIG. 10(b). This means that the Ti film has the highest boron ion concentration.

Figure 10A:
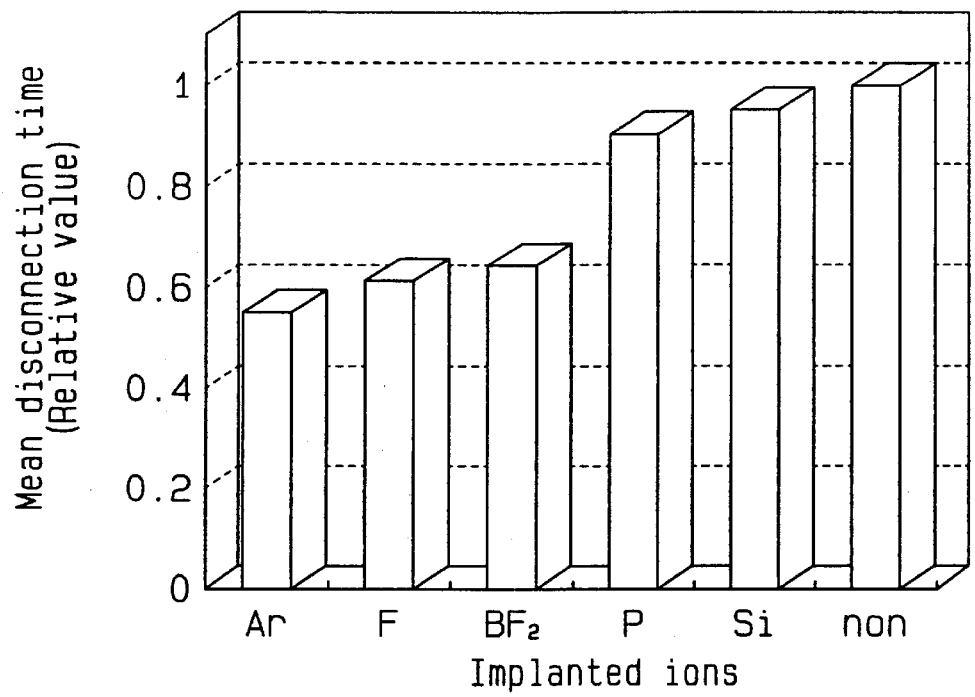
FIG. 10(a) is a graph showing characteristics of semiconductor devices produced according to the process illustrated in FIGS. 1 to 9.
Figure 10B:
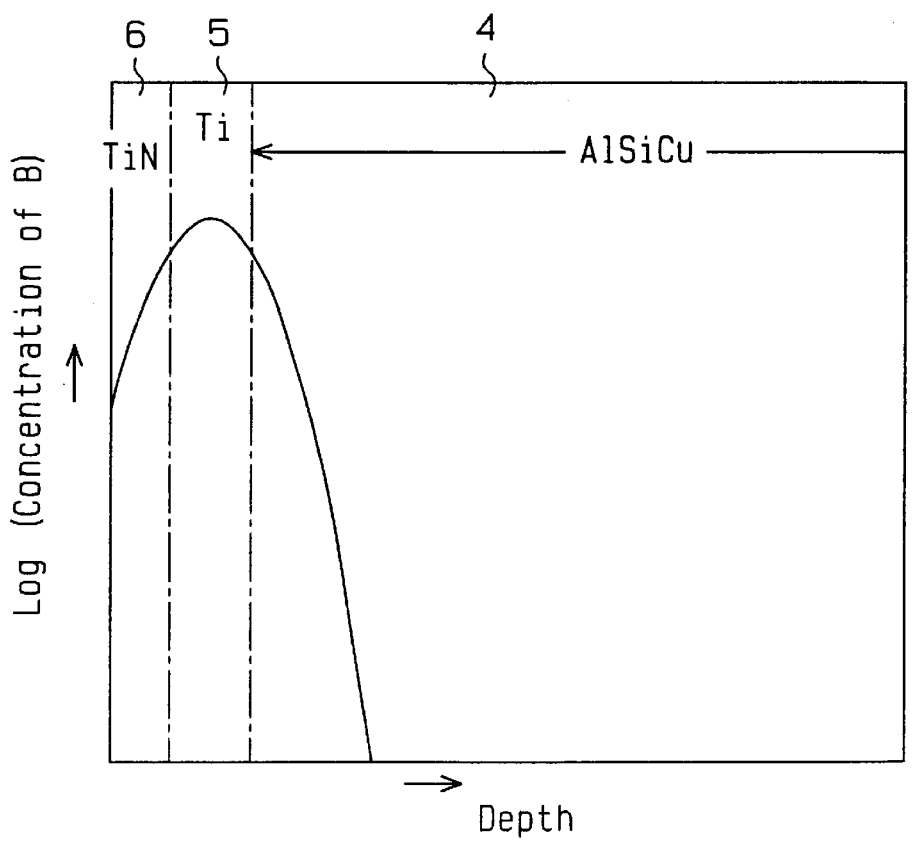
FIG. 10(b) is a graph showing the relationship between the depth of the implanted boron ions and the concentration of the boron ions.
Figure 11:
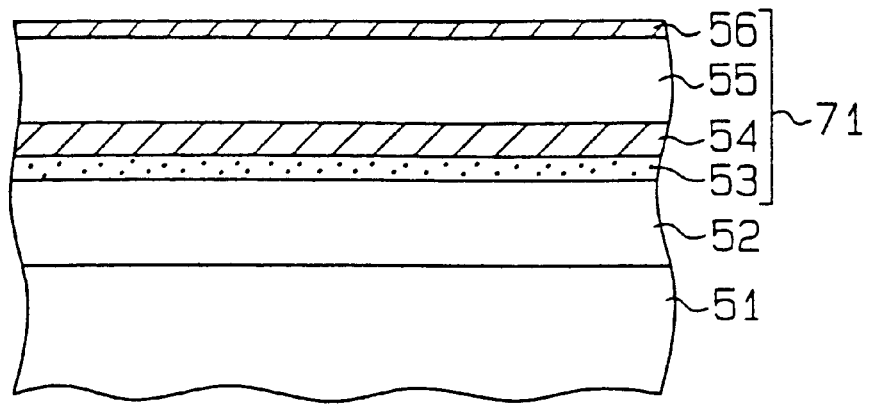
FIGS. 11 to 13 are schematic cross-sectional views showing a process for producing a prior art semiconductor device.
Figure 12:
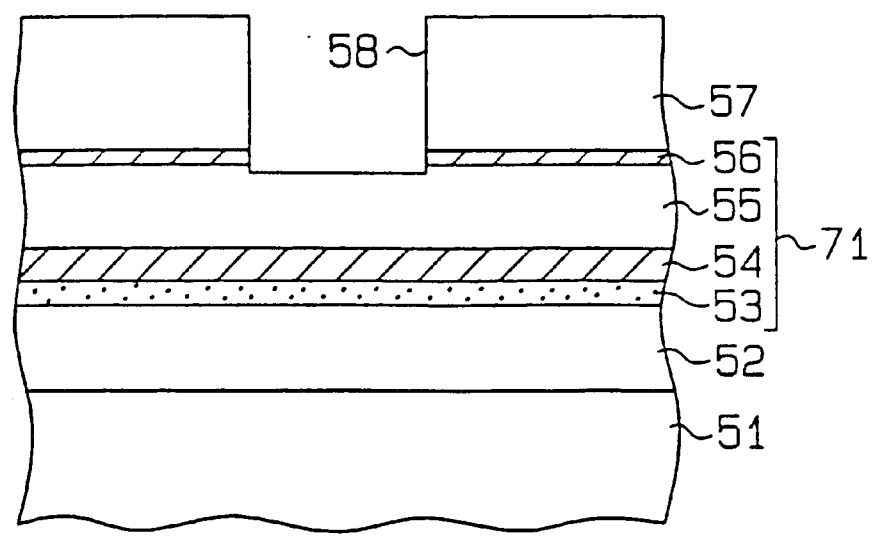
Figure 13:
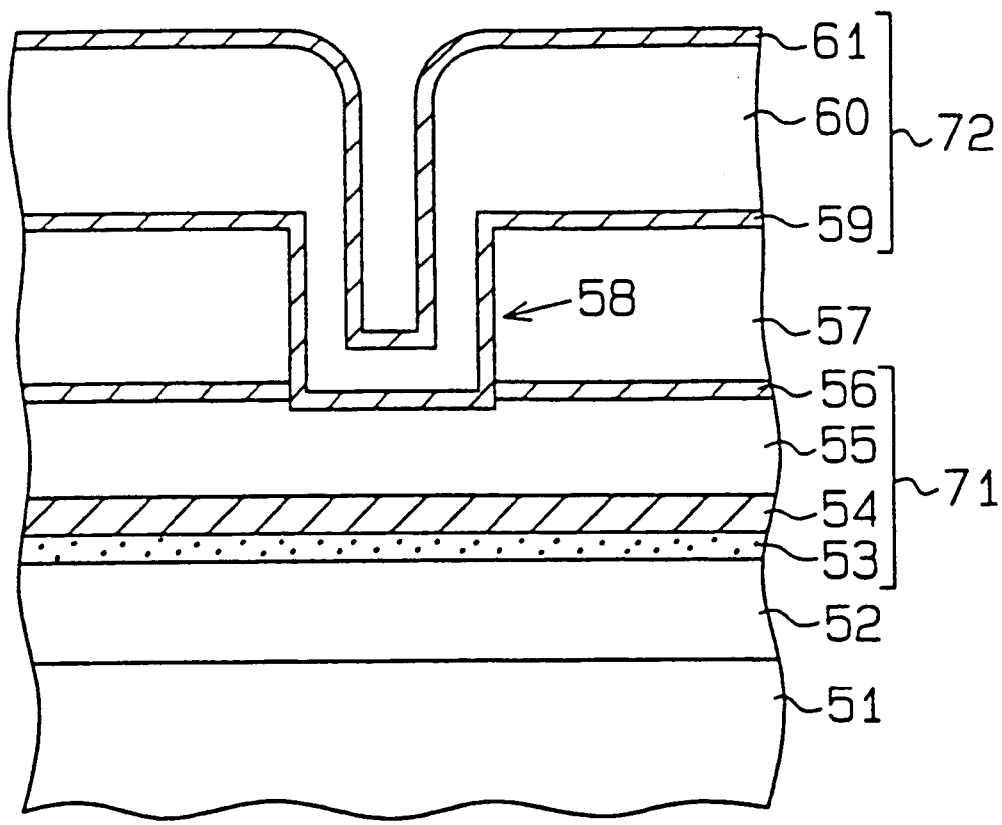

FIG. 10 (a) illustrates mean disconnection times of Al alloy films 4 implanted with various kinds of ions. The mean disconnection time refers to the average period of time from the time of flowing a constant current through wirings to the time of failure of the wirings. This measurement indicates the reliability of wirings.

The mean disconnection time can be reduced by implanting various kinds of ions into the Al alloy films 4. This is particularly true where argon (Ar), fluorine (F) and boron fluoride (BF$_2$) were implanted, respectively.

Based on these results, in this embodiments, the ion implantation conditions were set such that the peak of ion concentration distribution is in the Ti film 5. See FIG. 10(b). Thus, the little impurity is implanted in the Al alloy film 4 relative to other films to improve the mean disconnection time of the Al alloy film 4. If the peak of boron ion concentration is in the TiN film 6, the effectiveness of boron ion implantation is reduced.

Table 1 shows, for example, resistivity values of various kinds of Ti metal compounds, and TiB$_2$ has a very low resistivity compared with other metal compounds. Accordingly, the resistivity of the Ti film 5 implanted with boron ion is thus reduced.

TABLE 1

|  | TiB$_2$ | Ti | TiN | TiC |
| --- | --- | --- | --- | --- |
| Resistivity (Ω · cm) | 25 | 70 | 100 | 150 |

Figure 3:
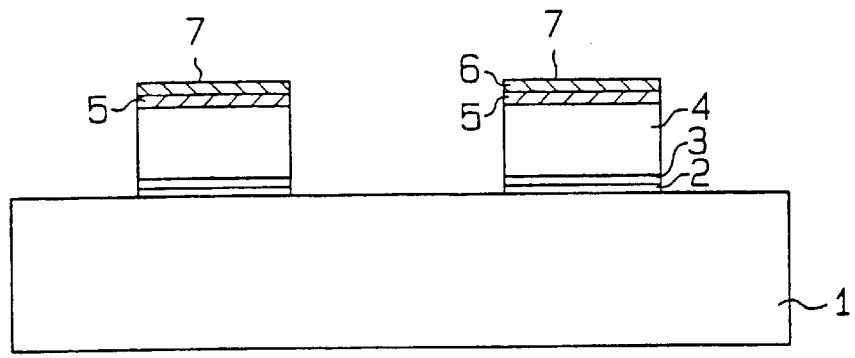

In Step 3 shown in FIG. 3, a first (lower) metal wiring 7 is formed from the first wiring layer 21 by means of photolithography and dry etching. In this step, the laminate structure in the first wiring layer 21 including the Ti film 2 and the TiN film 3 functions as a barrier metal, while the laminate structure including the Ti film 5 and the TiN film 6 functions as a cap metal.

Figure 4:
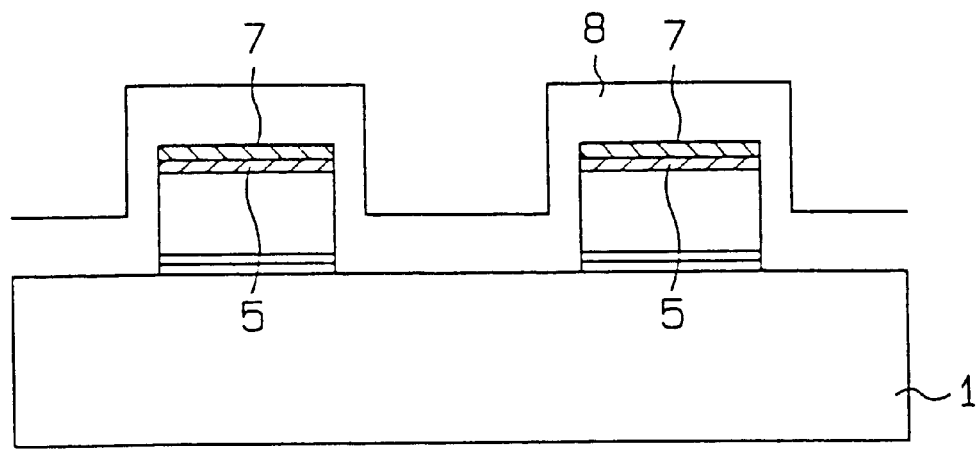

In Step 4 shown in FIG. 4, a plasma TEOS oxide film 8 (100 nm thick) is formed on the first metal wiring 7 by means of plasma CVD employing TEOS (tetra-ethoxy silane: Si(OC$_2$H$_5$)$_4$) and oxygen. The thickness of the plasma TEOS oxide film 8 is adjusted depending on steps present on the ground layer under the oxide film 8. If the steps are great, a thick oxide film 8 is formed; whereas, if they are small, a thin oxide film 8 is formed.

Figure 5:
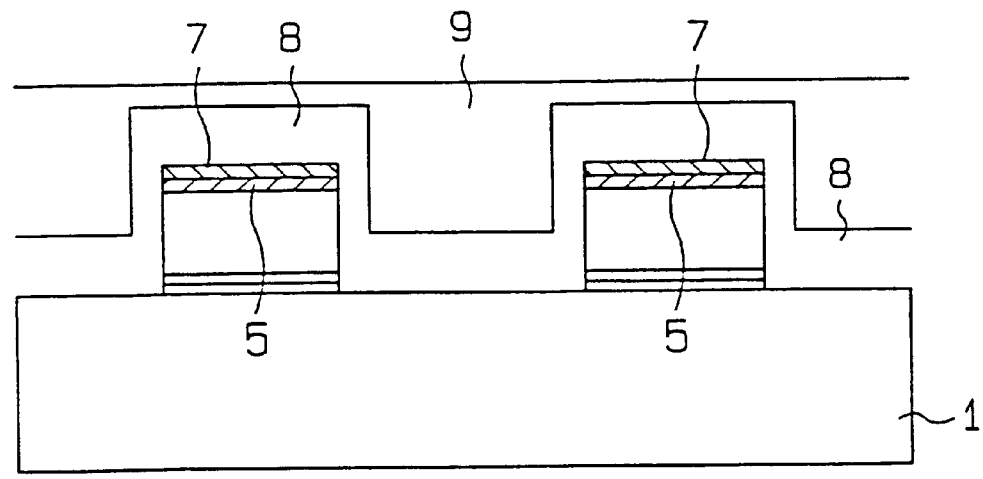

In Step 5 shown in FIG. 5, an organic SOG (spin-on-glass) film 9 is formed on the plasma TEOS oxide film 8. In Step 5, an organic SOG is applied onto the oxide film 8 to a thickness of 200 nm and it is applied again to a thickness of 200 nm, followed finally by baking at a temperature of about 450 C. Accordingly, portions of the organic SOG film 9 having no ground pattern have a total film thickness of 400 nm. The organic SOG film is a silicon oxide material that contains more than 1% carbon.

Figure 6:
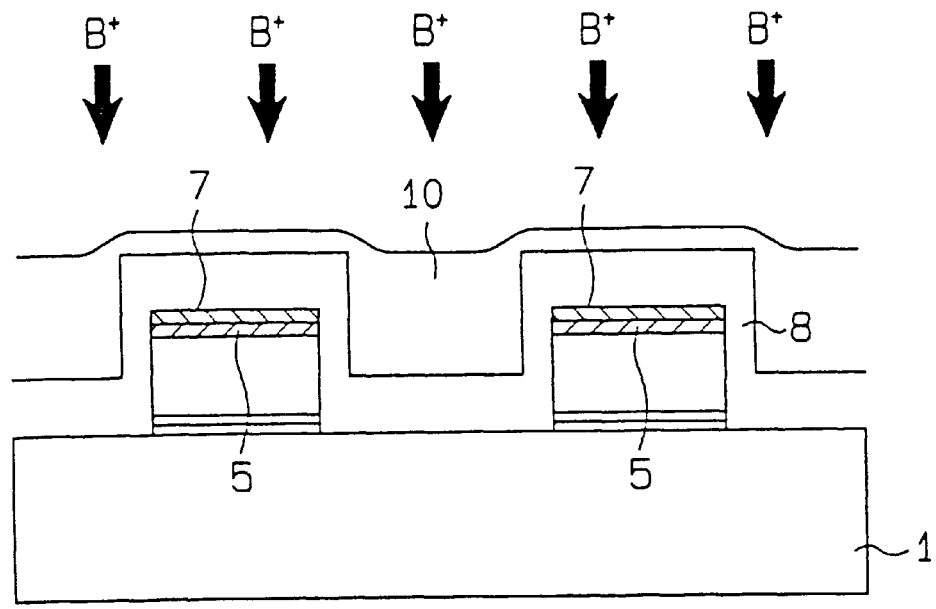

In Step 6 shown in FIG. 6, boron ion is implanted to the organic SOG film 9 by means of ion implantation. The implantation of ion into the organic SOG film 9 decomposes the organic components in the organic SOG film 9 and reduces the moisture and hydroxyl groups contained therein. Thus, the organic SOG film 9 is converted to an SOG film (hereinafter referred to as the modified SOG film) 10 containing little moisture and hydroxyl groups.

Figure 7:
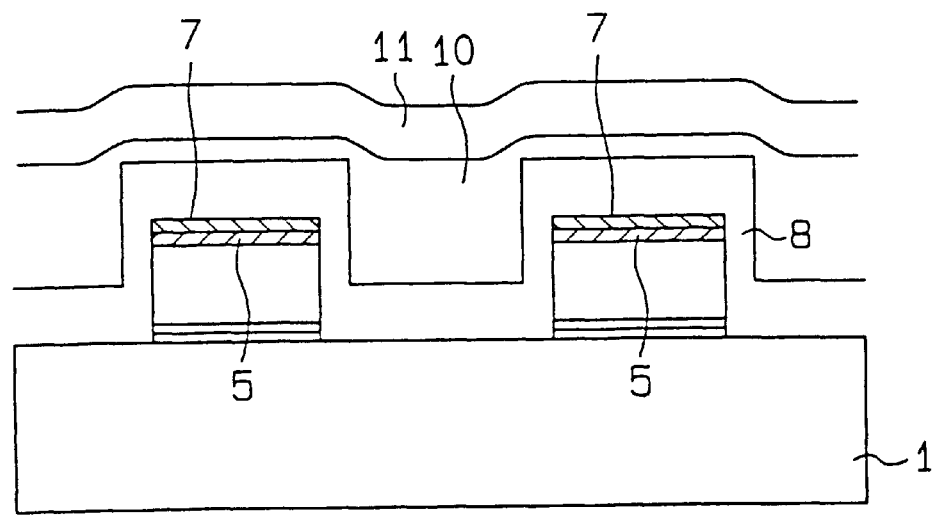

In Step 7 shown in FIG. 7, a plasma TEOS oxide film 11 (200 nm thick) is formed on the modified SOG film 10 by means of plasma CVD. The thickness of the plasma TEOS oxide film 11 is adjusted, like the plasma TEOS oxide film, depending on the steps present on the ground layer.

Figure 8:
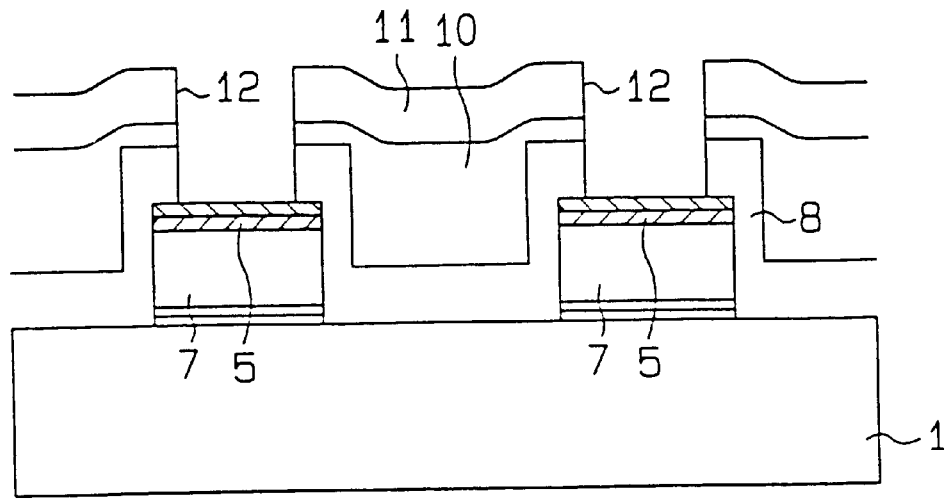

In Step 8 shown in FIG. 8, the thus treated substrate 1 is subjected to anisotropic etching employing a gaseous mixture of carbon tetrafluoride and hydrogen as an etching gas. Thus, via holes 12 or contact holes, which communicate to the first metal wiring 7, are formed through the films 8, 10 and 11.

Figure 9:
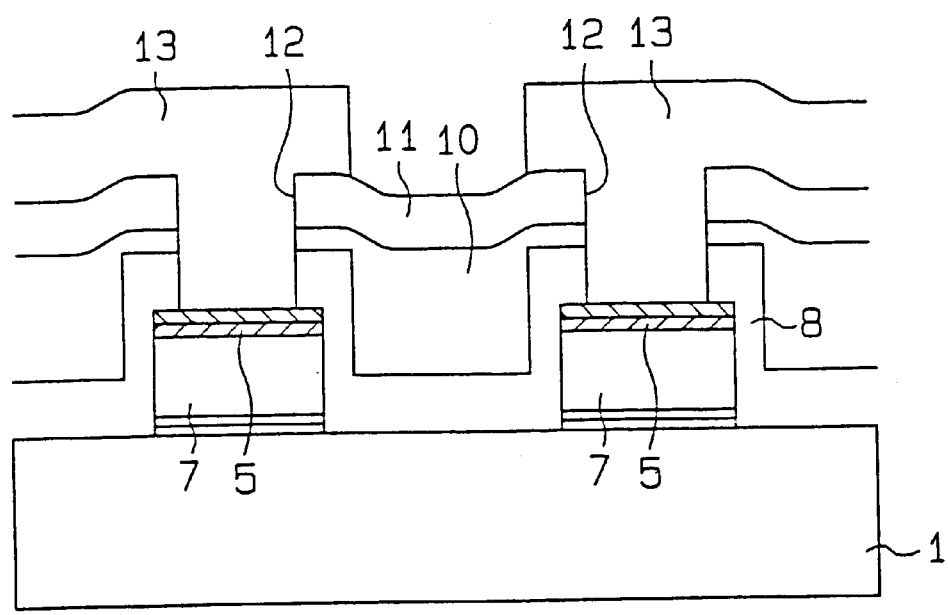

In Step 9 shown in FIG. 9, the bores of the via holes 12 are first cleaned by means of sputter etching employing an inert gas (e.g., Ar). Subsequently, an aluminum alloy film (Al—Si (1%)-Cu (0.5%), 500 nm thick), a Ti film (50 nm thick) and a TiN film (20 nm thick) are formed by means of magnetron sputtering successively in this order in the via holes 12 and on the plasma TEOS oxide film 11. Next, application of resist (not shown), irradiation and etching are carried out by employing conventional lithographic techniques. A dry etching technique.(RIE etc.) is performed to achieve patterning of the aluminum alloy film, Ti film and TiN film to a predetermined configuration, resulting in a second (upper) metal wiring 13.

According to the embodiment of the invention, an interlayer insulating film of a three-layer structure including the plasma TEOS oxide film 8, the modified SOG film 10 and the plasma TEOS oxide film 11 is formed. Like in the organic SOG film 9, the modified SOG film 10 can have the thickness of about 0.5 to 1 m. Accordingly, when the modified SOG film 10 is employed, the thickness of the layer insulating film can be increased, and thus the surface of a substrate 1 having large steps can be fully flattened.

The sandwich structure including the modified SOG film 10 sandwiched between the plasma TEOS oxide films 8 and 11 employed here enhances the insulating property and mechanical strength of the insulating film layer as a whole.

Further, since the modified SOG film 10 contains no organic component, the etching treatment for forming the via holes 12 can be carried out in an atmosphere of a gaseous mixture of carbon tetrafluoride and hydrogen. Accordingly, even if a photoresist is employed as an etching mask in the etching treatment, the photoresist is not attacked nor is the modified SOG film 10, which is masked by the photoresist, etched. Thus, fine via holes 12 can be formed accurately.

Furthermore, no organic component is contained in the modified SOG film 10, the modified SOG film 10 and plasma TEOS oxide films 8 and 11 can be etched at the same etching rate, and the modified SOG film 10 does not undergo shrinkage during an ashing treatment for removing the photoresist employed as the etching mask. Therefore, no cracking occurs in the modified SOG film 10. In addition, when the via holes 12 are packed with the material of the second metal wiring 13, no void is formed between the packing material and the modified SOG film 10. Thus, the second metal wiring 13 can be securely embedded into the via holes 12.

Since the modified SOG film 10 contains no organic component and very small amounts of moisture and hydroxyl groups, either or both of the plasma TEOS oxide films 8 and 11 can be omitted, and the modified SOG film 10 can be used in the form of single layer or double layer.

According to the embodiment described above, since the Ti film 5 is doped with a dopant (boron: B) by means of ion implantation, the resistance of the wirings is reduced. Accordingly, the thickness of the Ti film 5 itself can be reduced, and thus the entire thickness of the first metal wiring 7 can be reduced. In additon, contact resistance and electromigration resistance comparable to those in the prior art or lower can be maintained. Therefore, not only can finer and higher integration of semiconductor devices be realized, but also parasitic capacitance between the wirings can be reduced according to the reduction in the thickness of the wirings, which increases the speed of the devices.

Although only one embodiment of the present invention has been described so far, it should be apparent to those skilled in the art that the present invention may be embodied in many other specific forms without departing from the spirit or scope of the invention. Particularly, it should be understood that similar actions and effects can be exhibited if the present invention is embodied in the following forms:

1) The organic SOG film 9 may be replaced with a film of polyimide or siloxane-modified polyimide.
2) The plasma TEOS oxide films 8 and 11 may be replaced with silicon oxide films formed by other methods than the plasma CVD method, for example, by atmospheric pressure CVD, low pressure CVD, ECR plasma CVD, photo excited CVD, TEOS-CVD or PVD. The atmospheric pressure CVD employs a gaseous mixture of monosilane and oxygen ($SiH_{4+O2}$) and a film formation temperature of 400 C. or lower, whereas the low pressure CVD employs a gaseous mixture of monosilane and nitrogen suboxide ($SiH_{4+N_2O}$) and a film formation temperature of 900 C. or lower.
3) The plasma TEOS oxide films 8 and 11 may be replaced with other insulating films having, in addition to the property of blocking moisture and hydroxyl groups, high mechanical strength (e.g., silicon nitride films and silicate glass films). These insulating films may be formed by any method including CVD and PVD.
4) The aluminum alloy films in the first metal wiring 7 and the second metal wiring 13 may be replaced with films of other conducting materials such as copper, gold, silver, silicide, high-melting metals, doped polysilicons and titanium-nitride (TiN); alloys such as tungsten-titanium (TiW); or with laminated structures including such films.
5) The modified SOG film 10 may be subjected to heat treatment. Since the number of dangling bonds in the modified SOG film 10 can be reduced by heat treatment, hygroscopicity of the film and water permeability thereof can be reduced.
6) The modified SOG film 10 may be used as a passivation film. In this case, the film 10 serves as an excellent passivation film, which can securely protect the device mechanically and chemically.
7) While boron ion is employed as the ion to be implanted to the Ti film 5 in the foregoing embodiment, the boron ion may be replaced with other ions so long as they can reduce the resistance of the Ti film 5.
8) While the Ti film 5 is doped with an ion in the foregoing embodiment, the dopant is not limited to ions, but may be atoms, molecules or particles. These dopants are generally referred herein to as impurities.
9) The magnetron sputtering method employed in the foregoing embodiment may be replaced with other sputtering methods such as diode sputtering, high-frequency sputtering and four-pole sputtering.
10) The sputter etching employing an inert gas may be replaced with reactive ion beam etching (RIBE which is also referred to as reactive ion milling) employing a reactive gas (e.g., $CCl_4$, $SF_6$).
11) The plasma TEOS oxide film 11 may be omitted.
12) While ion implantation is employed for achieving ion doping of the Ti film 5, the ion may be introduced by means of ion shower doping or heat diffusion from other insulating films. Since boron ion is employed in the foregoing embodiment, a BSG (borosilicate glass) film is suitably employed as such insulating film.

Therefore, the present examples and embodiments are to be considered as illustrative and not restrictive, and the invention is not to be limited to the details given herein, but may be modified within the scope of the appended claims.

What is claimed is:

1. A method for producing a semiconductor device, comprising the steps of:

forming a first wiring layer on a semiconductor substrate, wherein the first wiring layer includes a primary wiring material and a secondary wiring material that are laminated to each other, wherein the secondary wiring material is located on the primary wiring material; and introducing an impurity into the first wiring layer, wherein a peak of concentration distribution of the impurity is in the secondary wiring material.

2. The method according to claim 1, further comprising the steps of:

forming an electric insulating film on the first wiring layer after the step of introducing the impurity;

forming a contact hole in the insulating film; and forming a second wiring layer on the insulating layer, the second wiring layer being electrically connected to the first wiring layer via the contact hole.

3. The method according to claim 1, wherein the primary wiring material includes one of aluminum and an aluminum alloy.

4. The method according to claim 3, wherein the secondary wiring material includes a titanium film.

5. The method according to claim 3, wherein the secondary wiring material includes a titanium film and a titanium nitride film that are laminated to each other.

6. The method according to claim 5, wherein the titanium nitride film is located on the titanium film.

7. The method according to claim 4, wherein a peak of concentration distribution of the impurity is in the titanium film.

8. The method according to claim 1, wherein the impurity is introduced by ion implantation.

9. The method according to claim 8, wherein the impurity includes boron ion.

10. A method for producing a semiconductor device, comprising the steps of:

forming a first wiring layer on a semiconductor substrate, wherein the first wiring layer includes a primary wiring material and a secondary wiring material that are laminated with each other, wherein the secondary wiring material is located on the primary wiring material;

introducing an impurity into the first wiring layer, wherein a peak of concentration distribution of the impurity is in the secondary wiring material;

forming an electric insulating film on the first wiring layer;

modifying the insulating film;

forming a contact hole in the modified insulating film; and forming a second wiring layer on the insulating film, the second layer being electrically connected to the first wiring layer via the contact hole.

11. The method according to claim 10, wherein the primary wiring material includes one of aluminum and an aluminum alloy.

12. The method according to claim 11, wherein the secondary wiring material includes a titanium film.

13. The method according to claim 11, wherein the secondary wiring material includes a titanium film and a titanium nitride film that are laminated to each other.

14. The method according to claim 13, wherein the titanium nitride film is located on the titanium film.

15. The method according to claim 12, wherein a peak of concentration distribution of the impurity is in the titanium film.

16. A method for producing a semiconductor device, comprising the steps of:

forming a first wiring layer on a semiconductor substrate, wherein the first wiring layer includes a primary wiring material and a secondary wiring material that are laminated to each other, wherein the secondary wiring material is located on the primary wiring material, wherein the primary wiring material includes one of aluminum and an aluminum alloy, wherein the secondary wiring material includes a titanium film and a titanium nitride film; and introducing an impurity into the first wiring layer, wherein a peak of concentration distribution of the impurity is in the secondary wiring material.

* * * * *